United States Patent
Fleishman

(10) Patent No.: US 6,979,996 B2
(45) Date of Patent: Dec. 27, 2005

(54) APPARATUS AND METHOD FOR AUTOMATIC ELIMINATION OF ROUND-TRIP DELAY ERRORS INDUCED BY AUTOMATIC TEST EQUIPMENT CALIBRATION

(75) Inventor: Thomas J. Fleishman, Poughkeepsie, NY (US)

(73) Assignee: International Business Machines Corporation, Armonk, NY (US)

(*) Notice: Subject to any disclaimer, the term of this patent is extended or adjusted under 35 U.S.C. 154(b) by 76 days.

(21) Appl. No.: 10/605,203

(22) Filed: Sep. 15, 2003

(65) Prior Publication Data

US 2005/0057257 A1 Mar. 17, 2005

(51) Int. Cl.⁷ .............................................. G01R 31/28
(52) U.S. Cl. ................................ 324/158.1; 324/765
(58) Field of Search ........................... 324/158.1, 754, 324/765; 714/700, 724

(56) References Cited

U.S. PATENT DOCUMENTS

| | | | |
|---|---|---|---|
| 4,109,117 A | 8/1978 | Wrench, Jr. et al. | |
| 4,837,521 A | 6/1989 | Herlein et al. | |
| 5,514,965 A | 5/1996 | Westwood | |
| 5,586,054 A | 12/1996 | Jensen et al. | |
| 6,052,810 A | * 4/2000 | Creek | 714/740 |
| 6,081,916 A | * 6/2000 | Whetsel, Jr. | 714/727 |
| 6,133,725 A | 10/2000 | Bowhers | |
| 6,304,987 B1 | * 10/2001 | Whetsel, Jr. | 714/724 |
| 6,492,797 B1 | 12/2002 | Maassen et al. | |
| 6,570,397 B2 | * 5/2003 | Mayder et al. | 324/754 |

\* cited by examiner

*Primary Examiner*—Ernest Karlsen
(74) *Attorney, Agent, or Firm*—DeLio & Peterson, LLC; Kelly M. Reynolds

(57) ABSTRACT

A Dual Channel Mode for selecting specific waveform sets or characters in the applied data eliminates round trip delay errors in automatic test equipment. Drive waveforms and data are directed by a compiler to a first channel, while receive waveforms and data are directed to a second channel, eliminating false readings induced by the round-trip delays. The drive and compare waveforms are separated onto the first and second channels of electronics.

13 Claims, 3 Drawing Sheets

APPARATUS AND METHOD FOR AUTOMATIC ELIMINATION OF ROUND-TRIP DELAY ERRORS INDUCED BY AUTOMATIC TEST EQUIPMENT CALIBRATION

BACKGROUND OF INVENTION

The invention relates to calibrating timing on a tester that tests integrated circuits. More specifically, the invention relates to compensating for the effects of round-trip delay on signals transmitted between the automatic test equipment and a device under test.

Current integrated circuit (IC) technologies continue to increase device speeds, requiring manufacturing process changes, adjustments, and modifications to accommodate the build and testing of the ICs. For example, faster test cycles and higher accuracy in the implementation and design of automated test equipment (ATE) are necessary to communicate with and perform in-situ testing of these high speed ICs.

Automated test equipment is used to simulate the operating conditions that an integrated circuit will experience when used in an application. An integrated circuit undergoing testing is known as a device under test (DUT). Generally, the ATE is controlled by a computer, which executes a set of instructions, generally software programmable instructions. The ATE presents the correct voltages, currents, timings, and functional states to the DUT and monitors the response from the DUT for each test applied. The ATE then compares the result of each test to pre-defined limits and a pass/fail decision is made. In a conventional test configuration, pin electronics apply test signals to nodes of the DUT, detect output signals produced by the DUT in response to applied test signals, and compare the detected output signals with expected values at times dictated by the timing edges provided by a timing generator.

One of the responsibilities of the ATE is to calibrate signal timing. Timing calibration corrects for time delays in routing a signal from the tester to a DUT, or conversely, from the DUT to the tester, or both, due to constraints present in the testing equipment. These timing delays are due to, in part, several layers of interconnections between the DUT and the tester. The round-trip delays significantly limit the programming flexibility of a tester, especially when testing high-speed electronic circuitry. Manual techniques to eliminate or reduce these delays are complex, time consuming, and error prone. The present invention reduces the complexity and eliminates errors induced by current testing techniques.

Adjustments for signal delays to the tester wiring are commonly made in ATE using a technique known as time domain reflectometry (TDR). Time domain reflectometry is a well-known technique for testing lines, in which, for example, one or more electrical test pulses are transmitted into a line at one end, and the voltage on the line at the same end is measured as a function of time after transmission of the test pulse. Any impedance mismatch in the line caused by a fault, for example, will cause a reflection of the test pulse to be detected at a time after transmission of the test pulse that corresponds to the position of the impedance mismatch along the line. TDR is used to detect discontinuities in the impedance of a cable or signal line, as well as the specific location of each discontinuity. The magnitude of each discontinuity is proportional to the applied signal. The impedance of a discontinuity is a function of transducer voltage. Adjustments to the ATE are then made depending upon the TDR measurements. The adjustments address the delays through pin driver electronics and pin receiver electronics, device test interface boards, and sockets. This adjustment of time for signal travel, while improving signal placement at the DUT, can actually induce errors if one does not factor in other significant variables, such as the proximity and types of the programmed signal edges and the TDR adjustment value.

FIG. 1 depicts a circuit diagram of a typical prior art tester circuit 10. A channel driver 12 receives drive data and sends a test signal to the DUT (not shown) through pin electronics, a device interface board wire 14, and a device socket 16. These interfaces impart time delays in the signal as the signal traverses through their length. A channel receiver circuit 18 receives the return test signal and DUT response signal, and compares the response to expected values. Time delays, $T_{pe}$, $T_{dib}$, and $T_s$ are associated with the time delay through the pin electronics, device interface board, and the socket, respectively. The signal delay equation is represented by the sum of the individual time delays:

$$T_{delay} = T_{pe} + T_{dib} + T_s$$

This equation assumes that the pin electronics time delay, $T_{pe}$, is approximately the same for both the driver and the receiver. If one desires a signal transition edge to occur at the DUT at $T_{desired}$, the tester must adjust the test time by moving the signal edge to emit from the channel driver circuit 12 earlier by an amount $T_{delay}$. Thus, the signal is transmitted out of the channel driver 12 at a time:

$$T_{driver} = T_{desired} - T_{delay}$$

Timing the signal for transmission at $T_{driver}$ places the edge of the transition signal at the DUT at $T_{desired}$. FIG. 2 depicts the input waveform at the channel driver, showing the delay in signal transmission.

Similarly, to adjust for the delay on the tester's measure and receive circuitry, which measures the signal coming out of the DUT, one needs to adjust for the signal propagation in the other direction. The delay effects on the waveform received for comparison is depicted in FIG. 3. The measured time at the comparator, $T_{measure}$, adds to the transmission delay time, $T_{delay}$, to obtain the received time delay, $T_{receive}$:

$$T_{receive} = T_{measure} + T_{delay}$$

However, a situation exists on device pins that are utilized as bidirectional. In this case, the tester needs to both apply a signal and measure a response on the same device pin. When the device data and test requirements cause a set of adjacent device cycles, where the tester transitions from measuring the device response to applying a signal, referred to as an output-to-input turnaround, the self-adjusting feature of the tester moves each signal edge to cause the tester to measure its own drive waveform. A problem occurs when the tester attempts to null out the inherent delay in the signal propagation time from the pin electronic circuitry to the DUT, and vice-versa.

The drive waveform edge occurs at $T_{driver} = T_{desired} - T_{delay}$, and the receive edge occurs at $T_{receive} = T_{measure} + T_{delay}$. When the difference between $T_{measure}$ and $T_{receive}$ become less than $T_{delay}$, the tester comparator circuit is actually measuring the tester drive circuit. FIG. 4 depicts the combined effects of TDR delay adjustments on waveforms. The signal overlap 40 due to autocorrection is shown for the difference in the measured cycle and the applied cycle. To eliminate this problem, the current state of the art has focused on reducing the delays from the channel pin electronics to the DUT, which has shown to be a costly endeavor.

Additionally, manual means have been used to adjust for errors induced by the self-correcting algorithms in the tester hardware and software. However, the complexities to the end user increase, and errors are frequently induced under these approaches. One such means is to program two adjacent channels in separate modes, one as an input and one as an output. All the waveforms and test data are then programmed to generate the appropriate waveforms and apply the appropriate data on each channel. This technique requires twice as many waveforms and twice as much data to program, taking up time and tester resources.

Another technique for eliminating this problem at the tester is for ATE to be developed with restrictions on the timing edge placement, especially for output-to-input cycles. This is commonly addressed by inserting a so-called dummy cycle. Effectively, a dummy cycle allows for the delays to catch up. The dummy cycle solves tester-induced error; however, it does not test the device under actual operating conditions.

The present invention details an apparatus and method, to be implemented by the ATE manufacturer, supplier, or other technician, which solves this round trip delay issue, and makes the tester channels appear as another mode that the end user can program using current programming techniques. In the preferred embodiment, this methodology is implemented in an ATE compiler.

Bearing in mind the problems and deficiencies of the prior art, it is therefore an object of the present invention to provide a method and apparatus to compensate for the effects of round-trip delay on signals transmitted between automatic test equipment and a device under test.

It is another object of the present invention to provide a method and apparatus to test and compensate for pins of a device under test that are utilized as bidirectional.

A further object of the invention is to provide a method and apparatus to allow an automatic test equipment tester to null out the inherent delay in signal propagation time from pin electronic circuitry to the device under test.

Still other objects and advantages of the invention will in part be obvious and will in part be apparent from the specification.

SUMMARY OF INVENTION

The above and other objects, which will be apparent to those skilled in art, are achieved in the present invention, which is directed to in a first aspect, an apparatus for eliminating time delay errors during automatic testing of electronics, using automatic test equipment comprising: device interface board wiring having a device interface board signal time delay; a device socket connected to the device interface board wiring, having a device socket signal time delay; first channel and second channel pin electronics wiring connected to the device interface board wiring, having pin electronics signal time delays; a first channel including a set of driver electronics, the set of driver electronics including inputs for receiving drive data, drive timing edge source data, and a first channel output, the first channel output transmitting information to a device under test through the first channel pin electronics, the device interface board wiring, and the device socket; a second channel having a set of receiver electronics, the set of receiver electronics including inputs for comparison data source information, comparison timing edge source information, and an output from the device under test; and a compiler to automatically route the drive timing edge source data, signal levels, and data to the first channel, and the comparison timing edge source information, signal levels, and data to the second channel; the first and second channels separate and distinct from one another and compensating for time delay errors when the device under test is electronically exercised. The time delay errors comprise round-trip timing errors from the automatic test equipment to the device under test, and from the device under test to the automatic test equipment. The time delay errors further comprise a summation of the pin electronics signal time delays, the device interface board signal time delay, and the device socket time delay. The first channel and second channel pin electronics signal time delays are approximately equal. At least one of the second channel inputs is electrically connected to the first channel output through the first and second channel pin electronics wiring and the device interface board wiring.

In a second aspect, the present invention is directed to a method for eliminating time delay errors during automatic testing of a device under test comprising: separating drive and compare waveforms onto first and second channels of electronics; routing drive timing edge source data, signal levels, and data to the first channel; routing comparison timing edge source information, signal levels, and data to the second channel; and compensating for the time delay errors when testing the device under test. The routing further includes programming an automatic test equipment compiler to configure internal signal switches to force all drive edges and waveforms to occur on the first channel and all compare waveforms to occur on the second channel. The drive edge waveforms and the compare waveforms are applied in a vector file identifying an appropriate tester cycle type and drive or compare data. The method further includes eliminating overlap of edges and data induced by implementing auto-correction schemes of the automatic test equipment's self-calibration using TDR delays.

In a third aspect, the present invention is directed to a program storage device readable by a machine, tangibly embodying a program of instructions executable by the machine to perform method steps for negating time delay errors during automatic testing of a device under test, the method steps comprising: separating drive and compare waveforms onto first and second channels of electronics; routing drive timing edge source data, signal levels, and data to the first channel; routing comparison timing edge source information, signal levels, and data to the second channel; and compensating for the time delay errors when testing the device under test.

BRIEF DESCRIPTION OF DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DETAILED DESCRIPTION

In describing the preferred embodiment of the present invention, reference will be made herein to FIGS. 1–5 of the drawings in which like numerals refer to like features of the invention.

The present invention includes an additional tester channel mode to the ATE to allow the tester compiler to automatically handle complicated waveform adjustments and data assignments. For this new tester mode, referred to as a Dual Channel Mode, specific waveform sets or characters in the applied data are selected for the appropriate drive waveform or compare waveform. Drive waveforms and data are directed by the compiler to a first channel, channel A, while receive waveforms and data are directed to a second channel, channel B, eliminating false readings induced by round-trip delays.

The addition of a tester channel mode works in an analogous fashion as a multiplexer. In a multiplex mode, two adjacent tester channels are assigned, and the test program addresses the timing edges and electrical conditions on a single channel. The multiplex mode assigns the additional edges from the second channel to the first channel. However, in a multiplex mode, only the first channel driver circuitry and receiver circuitry are used. Thus, the round-trip delay error is not eliminated.

Figure 1:
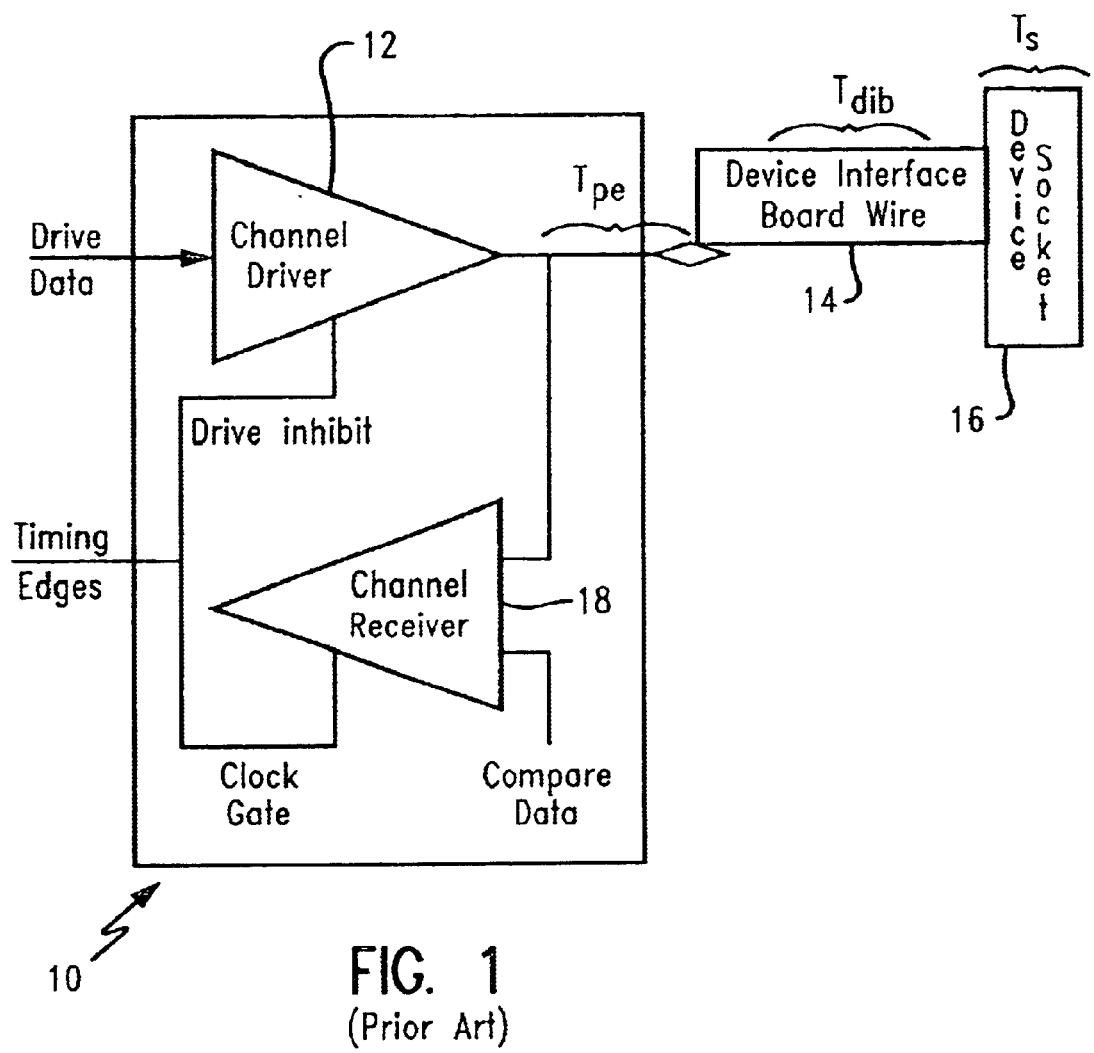
FIG. 1 depicts a circuit diagram of a typical prior art tester circuit.
Figure 2:
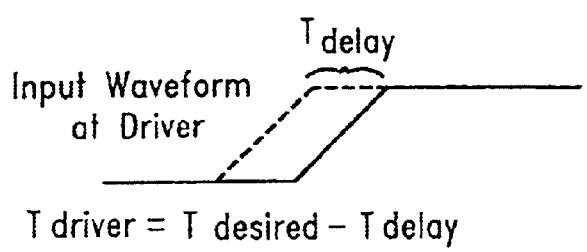
FIG. 2 depicts the input waveform at the channel driver, showing the delay in signal transmission.
Figure 3:
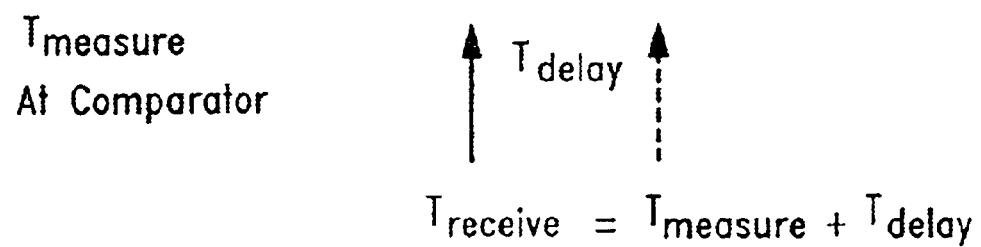
FIG. 3 depicts the delay effects on the waveform received for comparison.
Figure 4:
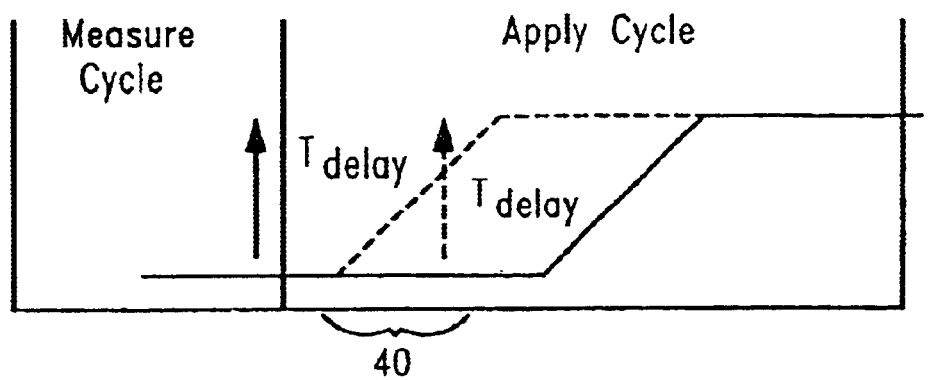
FIG. 4 depicts the combined effects of TDR delay adjustments on waveforms.
Figure 5:
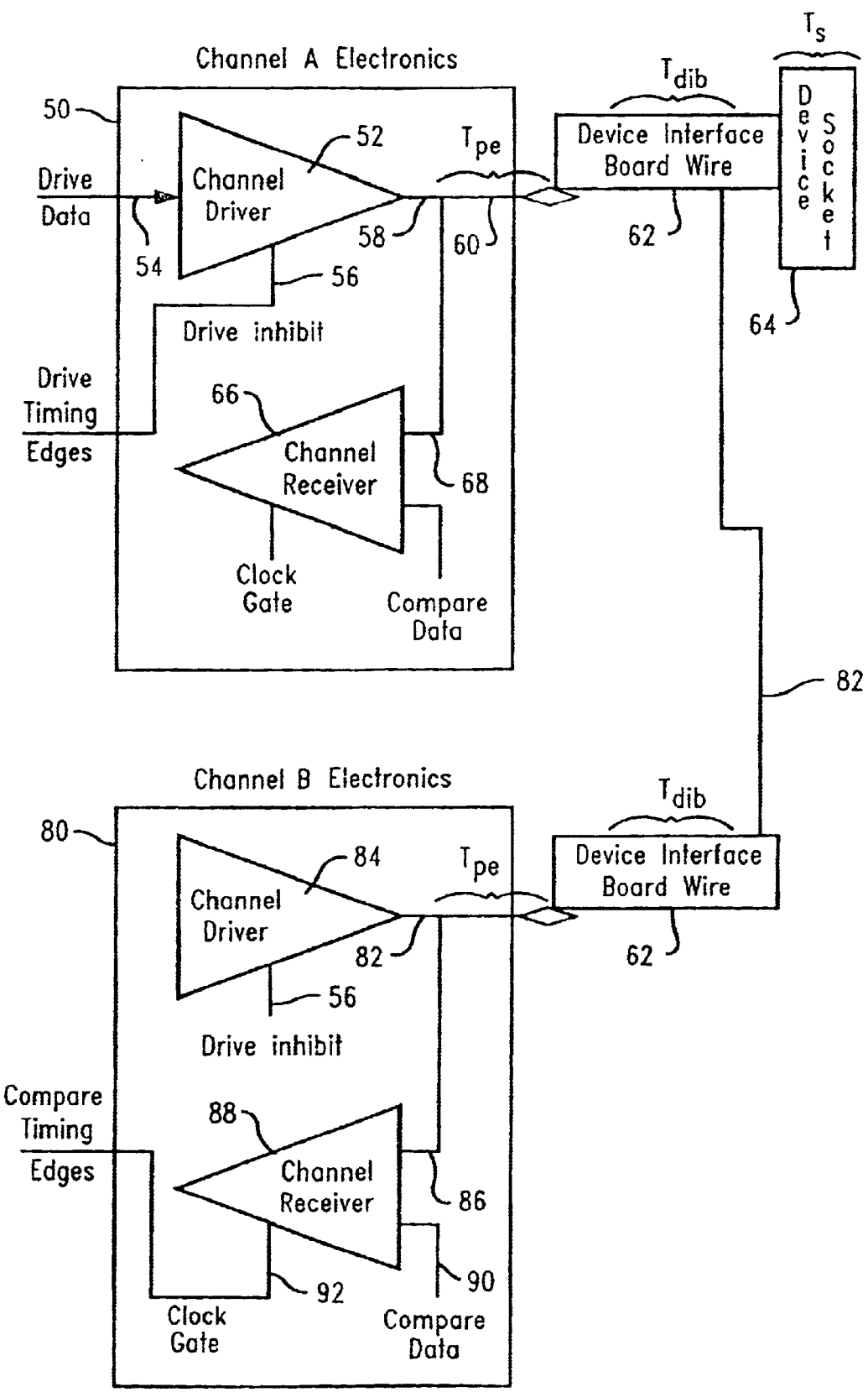
FIG. 5 depicts the dual mode configuration of the present invention.

In the preferred embodiment, the ATE compiler is programmed to configure the internal signal switches to force all drive edges and waveforms to occur on one channel and all compare waveforms to occur on an alternate channel. The data to be applied, in a vector file, identifies the appropriate tester cycle type and the drive or compare data. FIG. 5 depicts the dual mode configuration of the present invention. A first channel of electronics 50, channel A, comprises a channel driver 52 having an input 54 for drive data, a drive inhibit port 56 for drive timing edges, and an output 58 which sends a test signal to the DUT (not shown) through pin electronics 60, a device interface board wire 62, and a device socket 64. The output line 58 may also be electrically connected to a channel receiver 66 and input port 68; however, in the preferred embodiment, the channel receiver 66 is not activated. A dual driver-receiver pair, which is a second channel of electronics, referred to as the channel B electronics 80, interfaces with the output 58 of the channel A electronics through a signal line 82 that connects on the same printed circuit board as the channel A electronics, and is preferably made to be as short in length as possible, and should be made as close as possible to the DUT. In the preferred embodiment, the channel driver circuit 84 of the channel B electronics is not activated. Instead, channel receiver electronics 88 receives input data from signal line 82 through input port 86. A second input port 90 of the channel receiver electronics 88 receives compare data. The channel receiver electronics 88 is timed by compare data timing edges through a clock gate port 92. The time delays associated with signal transmission through the pin electronics, device interface board, and device socket, $T_{pe}$, $T_{dib}$, and $T_s$ respectively, are indicated for the signal lines. It is assumed that the delay time through the pin electronics, $T_{pe}$, is equivalent for both channels.

Implementation of the dual mode adjusts the timing delay equations by inducing an additional delay onto the comparator side, placing the signal at twice the $T_{delay}$ time from the receiver. This placement eliminates the comparator testing of the ATE's driver's signals, since the ATE driver's signals will not have traveled to the comparator in time, since the signals have almost twice as far to travel. The configuration may be implemented by adding the dual mode circuitry and modifying the compiler software accordingly to accommodate this operation. In addition, the tester may be made to self-calibrate as it does for all pins, and null out delays due to wiring. Table I depicts the timing mode comparison for the prior art input/output configuration, a multiplex configuration, and the dual mode configuration of the present invention. The data source identified may be from Channel A or Channel B.

TABLE 1

| | Timing Mode | | | | | |
|---|---|---|---|---|---|---|
| Tester Mode | Drive Timing Edge Source | Drive Data Source | Compare Timing Edge Source | Compare Data Source | Driver Used | Comparator Used |
| Input/Output | Ch. A | Ch. A | Ch. A | Ch. A | Ch. A | Ch. A |
| Multiplex | Ch. A | Ch. A | Ch. B | Ch. B | Ch. A | Ch. A |
| Dual Mode | Ch. A | Ch. A | Ch. B | Ch. B | Ch. A | Ch. B |

The dual mode configuration allows a programmer to program waveforms as if programming on a single tester channel. The compiler automatically routes drive edges, levels, and data to channel A, and compare edges, levels, and data to channel B. The separation of drive and compare electronics and waveforms onto separate channels eliminates the overlap of edges and data induced by autocorrection schemes of the tester's self-calibration using TDR delays.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. An apparatus for eliminating time delay errors during automatic testing of electronics, using automatic test equipment comprising:

device interface board wiring having a device interface board signal time delay;

a device socket connected to said device interface board wiring, having a device socket signal time delay;

first channel and second channel pin electronics wiring connected to said device interface board wiring, having pin electronics signal time delays;

a first channel including a set of driver electronics, said set of driver electronics including inputs for receiving drive data, drive timing edge source data, and a first channel output, said first channel output transmitting information to a device under test through said first channel pin electronics, said device interface board wiring, and said device socket;

a second channel having a set of receiver electronics, said set of receiver electronics including inputs for comparison data source information, comparison timing edge source information, and an output from said device under test; and a compiler to automatically route said drive timing edge source data, signal levels, and data to said first channel, and said comparison timing edge source information, signal levels, and data to said second channel;

said first and second channels separate and distinct from one another and compensating for time delay errors when said device under test is electronically exercised.

2. The apparatus of claim 1 wherein said time delay errors comprise round-trip timing errors from said automatic test equipment to said device under test, and from said device under test to said automatic test equipment.

3. The apparatus of claim 2 wherein said time delay errors comprise a summation of said pin electronics signal time delays, said device interface board signal time delay, and said device socket time delay.

4. The apparatus of claim 1 wherein said first channel and second channel pin electronics signal time delays are approximately equal.

5. The apparatus of claim 1 wherein said set of receiver electronics includes a comparator.

6. The apparatus of claim 1 wherein at least one of said second channel inputs is electrically connected to said first channel output through said first and second channel pin electronics wiring and said device interface board wiring.

7. The apparatus of claim 1 further including a set of receiver electronics in said first channel and a set of driver electronics in said second channel.

8. A method for eliminating time delay errors during automatic testing of a device under test comprising:

separating drive and compare waveforms onto first and second channels of electronics;

routing drive timing edge source data, signal levels, and data to said first channel;

routing comparison timing edge source information, signal levels, and data to said second channel; and compensating for said time delay errors when testing said device under test.

9. The method of claim 8 wherein said routing further includes programming an automatic test equipment compiler to configure internal signal switches to force all drive edges and waveforms to occur on said first channel and all compare waveforms to occur on said second channel.

10. The method of claim 9 further comprising applying said drive edge waveforms and said compare waveforms in a vector file identifying an appropriate tester cycle type and drive or compare data.

11. The method of claim 8 further including self-calibrating automatic test equipment for all pins, and nulling out any delays due to wiring.

12. The method of claim 9 further including eliminating overlap of edges and data induced by implementing auto-correction schemes of said automatic test equipment's self-calibration using TDR delays.

13. A program storage device readable by a machine, tangibly embodying a program of instructions executable by the machine to perform method steps for negating time delay errors during automatic testing of a device under test, said method steps comprising:

separating drive and compare waveforms onto first and second channels of electronics;

routing drive timing edge source data, signal levels, and data to said first channel;

routing comparison timing edge source information, signal levels, and data to said second channel; and compensating for said time delay errors when testing said device under test.

* * * * *